US012803522B2

(12) United States Patent
Kimbara et al.

(10) Patent No.: US 12,803,522 B2
(45) Date of Patent: Nov. 17, 2026

(54) ACOUSTIC WAVE DEVICE INCLUDING METAL PATTERN HAVING JAGGED PORTION

(71) Applicant: Sanan Japan Technology Corporation, Tokyo (JP)

(72) Inventors: Kanehisa Kimbara, Tokyo (JP); Shinichi Shioi, Tokyo (JP)

(73) Assignee: Sanan Japan Technology Corporation, Tokyo (JP)

( * ) Notice: Subject to any disclaimer, the term of this patent is extended or adjusted under 35 U.S.C. 154(b) by 467 days.

(21) Appl. No.: 18/513,156

(22) Filed: Nov. 17, 2023

(65) Prior Publication Data

US 2024/0171150 A1 May 23, 2024

(30) Foreign Application Priority Data

Nov. 21, 2022 (JP) ................................ 2022-185860

(51) Int. Cl.
*H03H 9/05* (2006.01)
*H03H 9/64* (2006.01)

(52) U.S. Cl.
CPC .......... *H03H 9/059* (2013.01); *H03H 9/0576* (2013.01); *H03H 9/64* (2013.01)

(58) Field of Classification Search
CPC ........ H03H 9/059; H03H 9/0576; H03H 9/64; H03H 9/0542; H03H 9/0566; H03H 9/1042; H03H 9/1085; H03H 9/1064; H03H 9/02086; H03H 9/02102; H03H 9/02818; H03H 9/02834; H03H 9/1007; H03H 9/171; H03H 9/25
See application file for complete search history.

(56) References Cited

U.S. PATENT DOCUMENTS 12,603,635 B2 * 4/2026 Koto .................... H03H 9/0523
2014/0368299 A1 * 12/2014 Yamashita ............. H03H 9/059 333/195
2018/0013404 A1 * 1/2018 Kawasaki .......... H03H 9/02834

FOREIGN PATENT DOCUMENTS

JP 2019054354 A 4/2019

* cited by examiner

*Primary Examiner* — Emily P Pham
(74) *Attorney, Agent, or Firm* — Dorsey & Whitney LLP

(57) ABSTRACT

An example acoustic wave device includes a wiring substrate, a device chip flip-chip bonded on the wiring substrate via a plurality of bumps, a metal pattern formed on an outer edge portion of the wiring substrate, the metal pattern includes an uneven portion or a jagged portion, a plurality of bump pads formed on the wiring substrate comprises an antenna pad, a transmitting pad, a receiving pad and a ground pad, a sealing resin member bonded to both the metal pattern and the wiring substrate, the sealing resin member hermetically seals the device chip, a region which is a tip direction of the uneven portion or the jagged portion formed to orient toward the outer edge of the wiring substrate, a region which is the tip direction of the uneven portion or the jagged portion formed to orient toward a center of the wiring substrate, and a surface acoustic wave resonator formed on the device chip and disposed in the vicinity of the first region or the second region.

13 Claims, 5 Drawing Sheets

ACOUSTIC WAVE DEVICE INCLUDING METAL PATTERN HAVING JAGGED PORTION

CROSS-REFERENCE TO RELATED APPLICATION(S)

This application claims priority to Japanese Application No. 2022-185860, filed Nov. 21, 2022, which are incorporated herein by reference, in their entirety, for any purpose.

BACKGROUND OF THE INVENTION

Field of the Invention

The present invention relates to acoustic wave devices.

Background Art

Mobile communication terminals typified by smartphones are required to correspond to a plurality of high-frequency bands. This has employed a front-end module mounted with a plurality of band-pass filters that allows to pass a communication in a high-frequency band.

As a front-end module, acoustic wave devices such as band-pass filters, duplexers, or quadruplexers are employed.

Patent Document 1 (JP2019-54354) discloses a technique related to an acoustic wave device.

A primary object to be solved by the present invention will be described.

A device chip such as a SAW filter is flip-chip bonded to a wiring substrate in an acoustic wave device such as a band-pass filter or a duplexer.

The resonator structuring the SAW filters forms a hollowed region for mechanical vibration and is sealed by synthetic resin or metal.

Since a resonator of an acoustic wave device generates heat by mechanical vibration or the like, a package structure superior in heat dissipation capability is desired.

In addition, it is desired that the adhesion between a sealing resin member and a wiring substrate is high in order to reduce the infiltration of moisture into the sealed hollowed region.

The sealing resin easily infiltrates between the wiring substrate and the device chip when the metal pattern formed on the outer edge of the wiring substrate is a jagged pattern oriented toward the center. It happens because the sealing resin has liquidity before the sealing process completed.

It is desirable to be considered to prevent coupling phenomenon or the like between the metal pattern which the electric signal of the desired frequency band passes through and the metal pattern which the electric signal of the desired frequency band does not pass through.

Poor heat dissipation may occur the deterioration of the characteristics, the power-resistant life, and the like. Also, poor adhesion between the sealing resin member and the wiring substrate is likely to rust the inside metal, and occurs the deterioration of the characteristics, deterioration in life, or the like. Further, the characteristics deteriorate when coupling phenomenon occurs. In addition, the possibility that the resin comes into contact with the resonator portion would be higher, when a large amount of the sealing resin infiltrates between the wiring substrate and the device chip.

SUMMARY OF THE INVENTION

The present invention is devised in view of the above problems. A purpose of the present invention is to provide an acoustic wave device superior in heat dissipation capability and adhesion between a sealing resin member and a wiring substrate, and the acoustic wave device includes excellent characteristics in which coupling between a metal pattern through which an electric signal of a desired frequency band passes and a metal pattern through which an electric signal of a desired frequency band does not pass is unlikely to occur, while an amount of infiltration of a sealing resin between the wiring substrate and a device chip is controlled.

In order to achieve the above object, according to the present invention, an acoustic wave device includes a wiring substrate, a device chip flip-chip bonded on the wiring substrate via a plurality of bumps, a metal pattern formed on an outer edge portion of the wiring substrate, the metal pattern includes an uneven portion or a jagged portion, a plurality of bump pads formed on the wiring substrate comprises an antenna pad, a transmitting pad, a receiving pad and a ground pad, a sealing resin member bonded to both the metal pattern and the wiring substrate, the sealing resin member hermetically seals the device chip, a first region which is a tip direction of the uneven portion or the jagged portion formed to orient toward the outer edge of the wiring substrate, a second region which is the tip direction of the uneven portion or the jagged portion formed to orient toward a center of the wiring substrate, and a surface acoustic wave resonator formed on the device chip and disposed in the vicinity of the first region or the second region.

BRIEF DESCRIPTION OF THE DRAWING

FIG. 6 part (b) is a diagram illustrating a state of a surface **5*b* in which the one of the device chips 5 of the acoustic wave device 1 according to the present embodiment is peeled off from the wiring substrate 3** and a resonator is formed.

DETAILED DESCRIPTION

First Embodiment

Embodiments of the present invention will now be described in details hereinafter with reference to the accompanying drawings.

Figure 1:
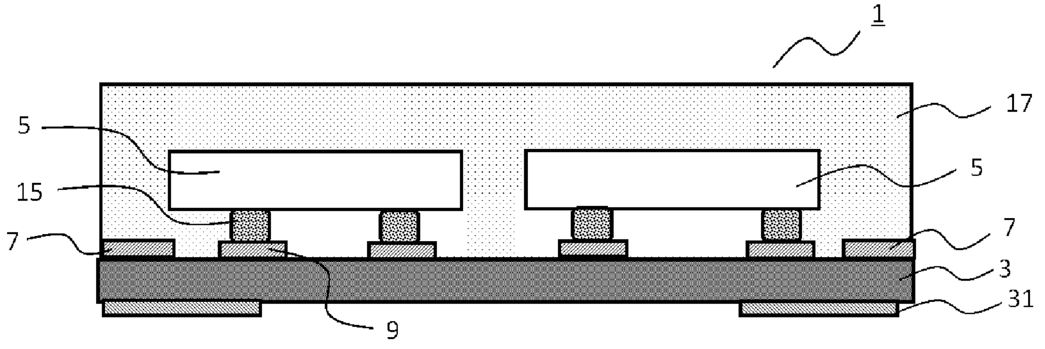
FIG. 1 is a cross-sectional view of an acoustic wave device 1 according to an embodiment of the present disclosure.

FIG. 1 is a cross-sectional view of an acoustic wave device 1 according to the present embodiment of the present disclosure.

As shown in FIG. 1, the acoustic wave device 1 according to the present embodiment includes a wiring substrate 3 and two device chips 5 mounted on the wiring substrate 3.

In the present embodiment, an example of an acoustic wave device which is a duplexer mounted with the two device chips 5 shown, but it should be understood that, as an application object of the present invention, the acoustic wave device as a band-pass filter in which the one device chip 5 is provided or a quadruplexer in which the four device chips 5 are provided may be used. In addition, a functional element for realizing a duplexer may be formed on the one device chip.

For example, a multilayer substrate made of resin or a plurality of dielectric layers made of low-temperature co-fired ceramic (Low Temperature Co-Fired Ceramics: LTCC) is used for the wiring substrate 3. Further, the wiring substrate 3 has a plurality of external connection terminals 31.

As the device chip 5, a substrate made of, for example, a piezoelectric single crystal such as lithium tantalate, lithium niobate, or quartz, or piezoelectric ceramics can be used.

The device chip 5 may be a substrate in which a piezoelectric substrate and a support substrate are bonded to each other. As the support substrate, for example, a sapphire substrate, an alumina substrate, a spinel substrate, or a silicon substrate can be used.

A metal pattern 7 and a plurality of bump pads 9 are formed on the wiring substrate 3. The metal pattern 7 is formed in an outer edge portion of the wiring substrate 3. The bump pad 9 is formed inside the metal pattern 7. As the metal pattern 7 and the bump pad 9, for example, copper or an alloy containing copper can be used. The metal pattern 7 and the bump pad 9 may for example have the thickness of 10 μm to 35 μm.

A sealing resin member 17 is formed to cover the device chip 5. The sealing resin member 17 may be made of, for example, an insulator such as a synthetic resin, or a metal. As the synthetic resin, for example, epoxy resin, polyimide, or the like can be used, but the present invention is not limited thereto. Preferably, an epoxy resin is used to form the sealing resin member 17 with a low temperature curing process.

The device chip 5 is mounted on the wiring substrate 3 via a bump 15 by flip-chip bonding.

As the bump 15, for example, a gold bump can be used. The height of the bump 15 is, for example, 20 μm to 50 μm.

The bump pad 9 is electrically connected to the device chip 5 via the bump 15.

Figure 2:
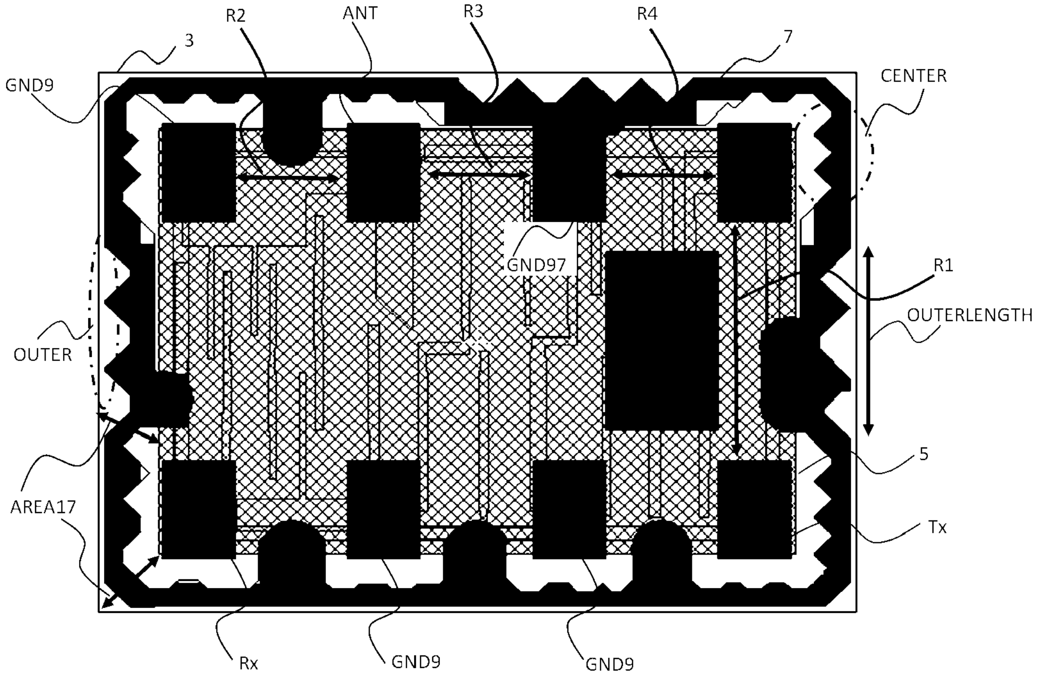
FIG. 2 is a diagram illustrating a configuration example of a main surface of a wiring substrate 3 on which a device chip 5 is mounted.

FIG. 2 is a diagram illustrating a configuration example of a main surface on which the device chip 5 of the wiring substrate 3 is mounted.

As shown in FIG. 2, the metal pattern 7 is formed in an outer edge of the wiring substrate 3. The metal pattern 7 has an uneven portion or a jagged portion. In addition, the metal pattern 7 includes a region OUTER formed such that a tip of the uneven portion or the jagged portion is oriented toward the outer edge of the wiring substrate 3. Further, the metal pattern 7 includes a region CENTER formed such that a tip of the uneven portion or the jagged portion is oriented toward the center of the wiring substrate 3.

The metal pattern 7 may be intermittently formed, because it is not entirely necessary to be a single metal pattern.

A region AREA17 sandwiched between a solid line indicating the outer edge of the wiring substrate 3 and a solid line indicating the outer edge of the device chip 5 indicates a region to which the sealing resin member 17 is bonded to.

The region AREA 17 to which the sealing resin member 17 is bonded includes a region to be bonded to the wiring substrate 3 and a region to be bonded to the metal pattern 7 formed on the wiring substrate 3. That is, the sealing resin member 17 (not shown in FIG. 2) is bonded to both the wiring substrate 3 and the metal pattern 7.

The metal pattern 7 enhances the thermal conductivity between the wiring substrate 3 and the sealing resin member 17, and improves the heat dissipation property of the acoustic wave device. The boundary line becomes long because the boundary of the region where the sealing resin member 17 is bonded to the wiring substrate 3 and the region where the sealing resin member 17 is bonded to the metal pattern 7 is uneven or jagged shape. Further, the sealing resin member 17 enters in the concave portion of the metal pattern 7 of the uneven shape, or in the valley portion of the metal pattern 7 of the jagged shape. This exerts the anchor effect, and enhances the adhesion between the sealing resin member 17 and the wiring substrate 3.

As shown in FIG. 2, the plurality of bump pads 9 are formed on the wiring substrate 3. The plurality of bump pads 9 includes an antenna pad ANT, a transmitting pad Tx, a receiving pad Rx, and a ground pad GND 9. In addition, some of the bump pads, for example, a ground pad GND 97, are electrically connected to the metal pattern 7, and are formed as the bump pad GND 9 which is designed as the ground potential. This can strengthen the ground.

As shown in FIG. 2, the metal pattern 7 formed in peripheral region of the antenna pad ANT, the transmitting pad Tx and the receiving pad Rx, and it is preferable that the tip of the uneven portion or the jagged portion of the metal pattern 7 is oriented toward the center of the wiring substrate 3. This can sufficiently suppress the generation of the coupling phenomena because the parasitic capacitance between the antenna pad ANT, the transmitting pad Tx or the receiving pad Rx and the metal pattern 7 can be limited.

As shown in FIG. 2, the wiring substrate 3 is a substantially rectangular shape having a long side and a short side. In region R1 between two bump pads arranged along the short side direction, the length OUTERLENGTH of the region in which the tip direction of the uneven or the jagged shaped portion of the metal pattern 7 that is oriented toward the outer edge of the wiring substrate 3 is longer than the length of each of the regions in which the tip direction of the uneven or jagged shaped portion is oriented toward the center of the wiring substrate 3.

Here, there is a problem that the sealing resin infiltrates between the wiring substrate 3 and the device chip 5 and comes into contact with a functional element formed on the device chip 5 in the step of forming the sealing resin member 17. In the region CENTER formed so that the direction of the tip of the uneven or the jagged shaped portion is oriented toward the center of the wiring substrate 3, the press during the sealing resin member 17 makes the metal pattern 7 a wall and the sealing resin easily infiltrates between the wiring substrate 3 and the device chip 5 since the thickness of the metal pattern 7 is considerably 10 μm to 35 μm for example.

It is desirable to make the length OUTERLENGTH as long as possible in the region R1 because the functional element is often formed relatively close to the outer edge of the device chip 5 along the short side direction of the wiring substrate 3.

It is desirable that the resonator on the device chip 5 disposed in the vicinity of the region CENTER formed so that the direction of the tip of the uneven or the jagged shaped portion is oriented toward the center of the wiring substrate 3 is formed at a position as far as possible from the outer edge of the device chip 5. Further, it is desirable that the resonator on the device chip 5 disposed in the vicinity of the region OUTER formed so that the direction of the tip of the uneven or the jagged shaped portion is oriented toward the outer edge of the wiring substrate 3 is formed close to the outer edge of the device chip 5 from the viewpoint of space-efficiency because it is unlikely that the sealing resin infiltrates and comes into contact even though it is formed close to the outer edge of the device chip 5.

As shown in FIG. 2, four bump pads are arranged in the long side direction of the wiring substrate 3. This forms three regions R2, R3, R4 between each bump pads. In the region R2 is a region between bump pads. A length of the region formed in the region R2 in the tip direction of the uneven or the jagged shaped portion of the metal pattern 7 that is oriented toward the outer edge of the wiring substrate 3 is shorter than a length of the region formed in the region R2 in the tip direction of the uneven or jagged shaped portion that is oriented toward the center of the wiring substrate 3.

In the region R3 and the region R4 are regions between bump pads in which a length of a region formed in the region R3 and/or region R4 in the tip direction of the uneven or the jagged portion of the metal pattern 7 that is oriented toward the outer edge of the wiring substrate 3 is longer than a length of a region formed in the region R3 and/or region R4 in the tip direction of an uneven portion or a jagged portion of the metal pattern 7 that is oriented toward the center of the wiring substrate 3.

The region R3 and the region R4 are contiguous, the two regions, between the bump pads respectively, having lengths in the tip direction of the uneven or the jagged portion of the metal pattern 7 that is oriented toward the outer edge of the wiring substrate 3 are longer than lengths in the tip direction of the uneven or the jagged portion of the metal pattern 7 that is oriented toward the center of the wiring substrate 3, the regions are consecutively formed. The bump pad formed in the center of the region R3 and the region R4 is a ground pad GND97. As described above, the ground pad GND97 is electrically connected to the metal pattern 7.

Figure 3:
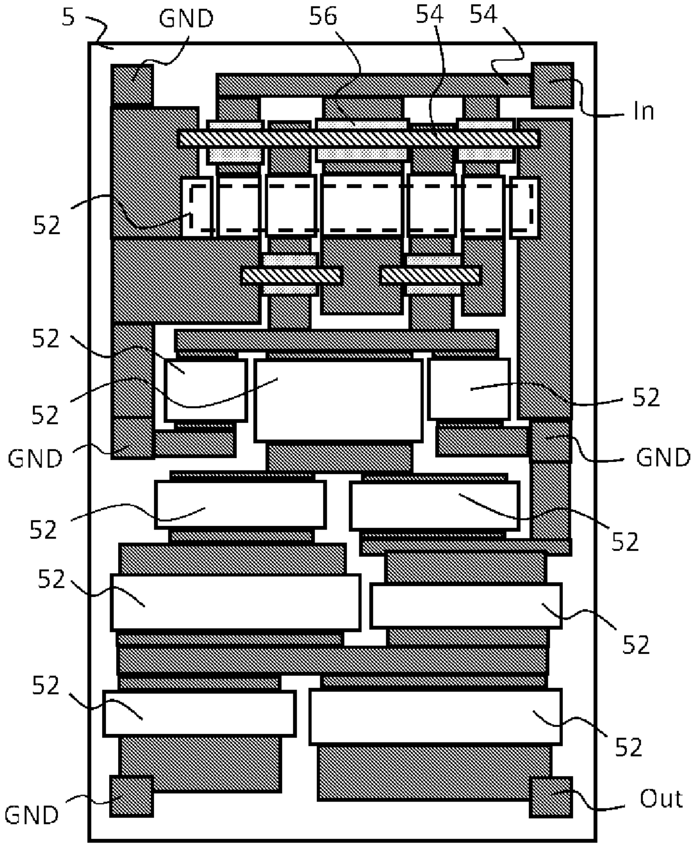
FIG. 3 is a diagram for explaining a configuration of the device chip 5.

FIG. 3 is a diagram for explaining a configuration of the device chip 5.

As shown in FIG. 3, an acoustic wave element 52 and a wiring pattern 54 are formed on the device chip 5.

An insulator 56 is formed on the wiring pattern 54. As the insulator 56, for example, polyimide can be used. The insulator 56 is formed of a film having the thickness of, for example, 1000 nm.

The wiring pattern 54 is also formed on the insulator 56, and wiring is formed so as to three-dimensionally cross each other via the insulator 56.

The acoustic wave element 52 and the wiring pattern 54 are made of an alloy or an appropriate metal such as silver, aluminum, copper, titanium, or palladium. The metal patterns may be formed of a laminated metal film formed by laminating a plurality of metal layers. The acoustic wave element 52 and the wiring pattern 54 may have the thickness of, for example, 150 nm to 400 nm.

The wiring pattern 54 includes wiring constituting the input pad In, the output pad Out, and the ground pad GND. The wiring pattern 54 is electrically connected to the acoustic wave element 52.

As shown in FIG. 3, forming a plurality of acoustic wave elements 52 can form, for example, a band-pass filter. The bandpass filter is designed to pass an electric signal having only a desired frequency band among the electric signals input from the input-pad In.

The electric signal input from the input-pad In passes through the band-pass filter, and an electric signal of a desired frequency band is output to the output-pad Out.

The electric signal output to the output pad Out is output from an external connecting terminal 31 of the wiring substrate 3 via a bump 15 and the bump pad 9.

Figure 4:
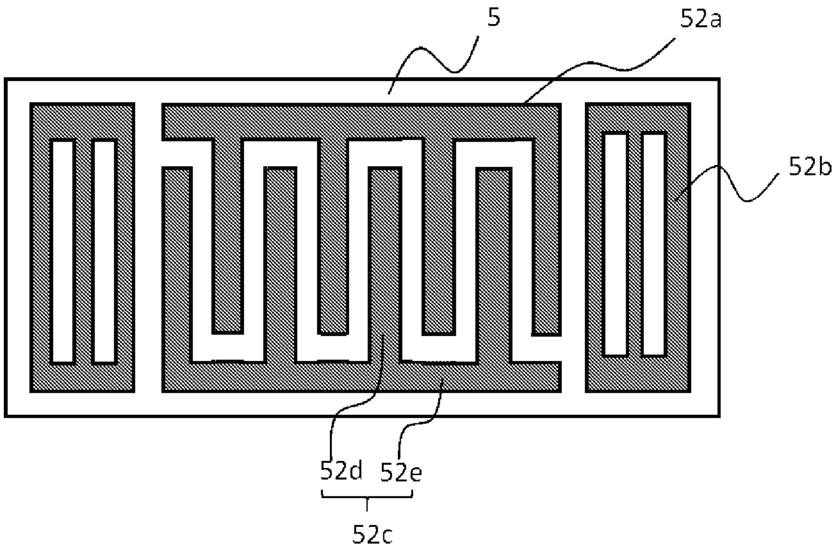
FIG. 4 is a plan view illustrating an example in which an acoustic wave element 52 is a surface acoustic wave resonator.

FIG. 4 is a plan view illustrating an example in which the acoustic wave element 52 is a surface acoustic wave resonator.

As shown in FIG. 4, IDT (Interdigital Transducer) 52*a* exciting a surface-acoustic wave and a reflector 52*b* are formed on the device chip 5. IDT 52*a* has a pair of comb-shaped electrode 52*c* opposed to each other.

The comb-shaped electrode 52*c* has a busbar 52*e* connecting a plurality of electrode fingers 52*d* and the plurality of electrode fingers 52*d*. The reflector 52*b* are provided on both sides of IDT52*a*.

IDT 52*a* and the reflector 52*b* are made of, for example, aluminium-copper alloys. IDT 52*a* and the reflector 52*b* have the thickness of, for example, 150 nm to 400 nm.

IDT 52*a* and reflector 52*b* may include an appropriate metal, such as titanium, palladium, silver, or the like, and may be formed of these alloys. IDT 52*a* and the reflector 52*b* may be formed of a laminated metal film formed by laminating a plurality of metal layers.

Figure 5:
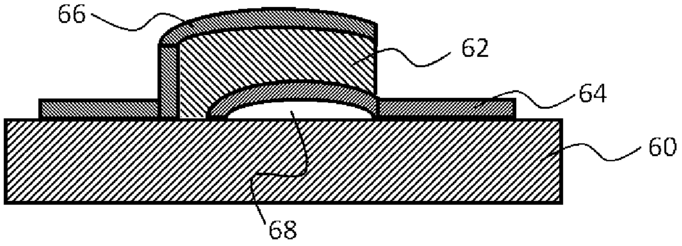
FIG. 5 is a cross-sectional view illustrating an example in which the acoustic wave element 52 is a piezoelectric thin film resonator.

FIG. 5 is a cross-sectional view illustrating an example in which the acoustic wave element 52 is a piezoelectric thin film resonator.

As shown in FIG. 5, a piezoelectric film 62 is provided on a chip substrate 60. A lower electrode 64 and un upper electrode 66 are provided so as to sandwich the piezoelectric film 62. An air gap 68 is formed between the lower electrode 64 and the chip substrate 60. The lower electrode 64 and the upper electrode 66 excite an acoustic wave in the thickness extensional vibration mode inside the piezoelectric film 62.

As the chip substrate 60, for example, a semiconductor substrate such as silicon or an insulating substrate such as sapphire, alumina, spinel, or glass can be used. For example, aluminum nitride can be used for the piezoelectric film 62. A metal such as ruthenium can be used for the lower electrode 64 and the upper electrode 66 for example.

The acoustic wave element 52 can be appropriately employed in a multimode filter or a ladder filter so as to obtain characteristics as a desired band-pass filter.

Figure 6:
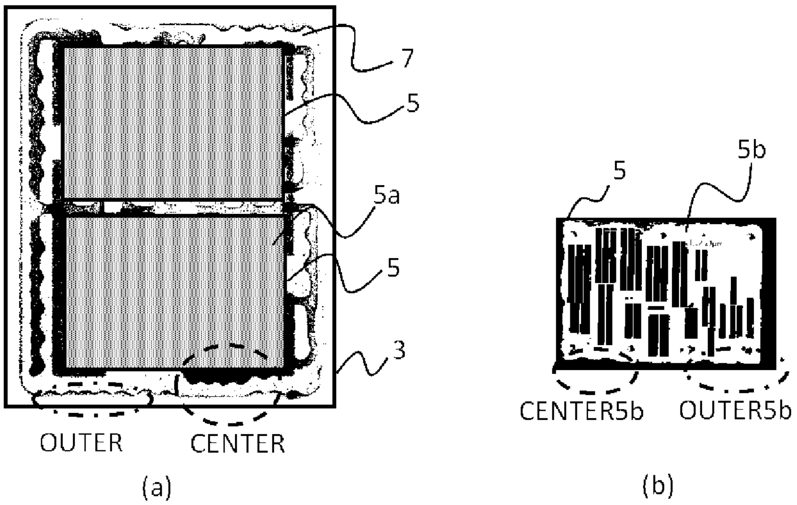
FIG. 6 part (a) is a diagram illustrating a state in which the two device chips 5 are mounted on the wiring substrate 3 by flip-chip bonding.

FIG. 6 part (a) is a diagram illustrating a state in which the two device chips 5 are mounted on the wiring substrate 3 by flip-chip bonding. FIG. 6 part (b) is a diagram illustrating a state of a surface 5*b* in which the one of the device chips 5 of the acoustic wave device 1 according to the present embodiment is peeled off from the wiring substrate 3 and a resonator is formed.

As shown in FIG. 6 part (a), the metal pattern 7 formed on the wiring substrate 3 includes the region OUTER formed such that the tip direction of the uneven or the jagged portion of the metal pattern 7 is oriented toward the outer edge of the wiring substrate 3, and the region CENTER formed such that the tip direction of the uneven or the jagged portion of the metal pattern 7 is oriented toward the center of the wiring substrate 3. The two device chips 5 are mounted on the wiring substrate 3 by flip-chip bonding and sealed by a sealing resin member (not shown). As shown in FIG. 6 part (a), no resonator is formed on the surface 5*a* of the device chip 5 that does not oppose the wiring substrate 3.

FIG. 6 part (b) shows the state of the surface 5*b* that has been peeled off from the wiring substrate 3, turned upside down, and opposed to the wiring substrate 3 of the device chip 5. A plurality of functional elements are formed on the surface 5*b*. In addition, the black portion of the outer edge portion of the surface 5*b* is a resin that has infiltrated between the wiring substrate 3 and the device chip 5 in the sealing step. Since the device chip 5 is turned upside down, the region CENTER5*b* surrounded by the dotted line is located at a position corresponding to the region CENTER shown in FIG. 6 part (a) when mounted on the wiring substrate 3. Similarly, the region OUTER5*b* surrounded by the dotted line is located at a position corresponding to the region OUTER shown in FIG. 6 part (a) when mounted on the wiring substrate 3.

Here, as seen from FIG. 6 part (b), the amount of the resin which infiltrates into the region CENTER5*b* is larger than that of the region OUTER5*b*. Therefore, when the amount of infiltration of the resin is desired to be reduced as much as possible, for example, the metal pattern 7 on the wiring substrate 3 at a position corresponding to the region where the resonator is arranged in the vicinity of the region close to the outer edge of the device chip 5 may be formed so that the tip direction of the uneven or the jagged portion of the metal pattern 7 is oriented toward the outer edge of the wiring substrate 3.

According to the first embodiment of the present invention described above, it is possible to provide an acoustic wave device superior in heat dissipation capability and adhesion between a sealing resin member and a wiring substrate, and the acoustic wave device includes excellent characteristics in which coupling between a metal pattern through which an electric signal of a desired frequency band passes and a metal pattern through which an electric signal of a desired frequency band does not pass is unlikely to occur, while an amount of infiltration of a sealing resin between the wiring substrate and a device chip is controlled.

Second Embodiment

Next, the second embodiment of the present invention will be described.

Figure 7:
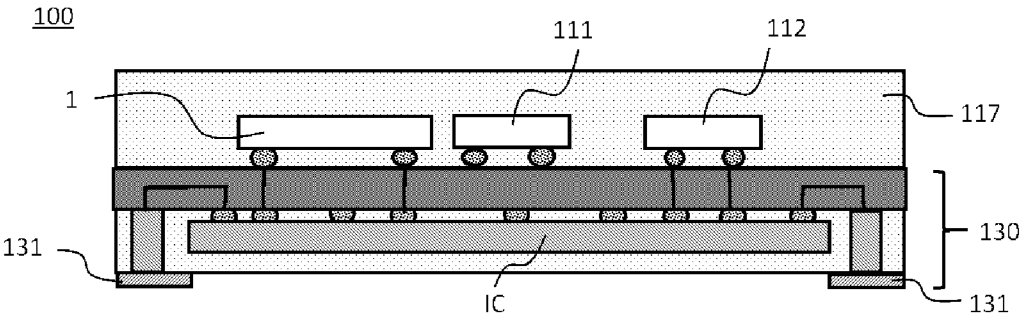
FIG. 7 is a cross-sectional view of a module 100 according to a second embodiment of the present invention.

FIG. 7 is the cross-sectional view of the module 100 according to the second embodiment of the present invention.

As shown in FIG. 7, the acoustic wave device 1 is mounted on the main surface of a wiring substrate 130. The acoustic wave device 1 may be, for example, a dual filter including a first bandpass filter BPF1 and a second bandpass filter BPF2, although not shown.

The wiring substrate 130 has a plurality of external connection terminals 131. The plurality of external connection terminals 131 are mounted on a motherboard of a specific mobile communication terminal.

On the main surface of the wiring substrate 130 a first inductance 111 and a second inductor 112 are mounted for impedance matching. The module 100 is sealed by a sealing resin member 117 for sealing a plurality of electronic components including the acoustic wave device 1.

An integrated-circuit component IC is mounted inside the circuit substrate 130. Although not shown, the integrated circuit component IC includes a switching circuit SW, a first low-noise amplifier LNA1, and a second low-noise amplifier LNA2.

Figure 8:
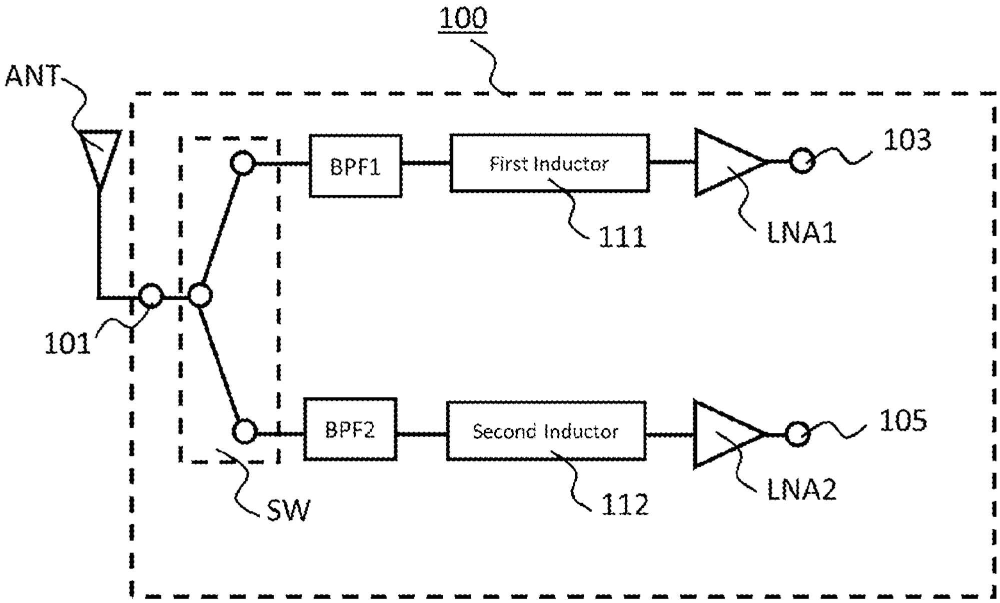
FIG. 8 is a schematic view illustrating a circuit configuration of the module 100.

FIG. 8 is a schematic view illustrating the circuit configuration of the module 100.

As shown in FIG. 8, the common-input terminal 101 (the external-connection terminal 131) of the module 100 is connected to the antenna terminal ANT. A first output terminal 103 and a second output terminal 105 (the external connection terminal 131) are connected to a signal processing circuit (not shown).

A signal passing through the first band-pass filter BPF1 and a signal passing through the second band-pass filter BPF2 are separated by the switching circuit SW from the common-input terminal 101.

The signal that has passed through the first band-pass filter BPF1 is impedance-matched by the first inductor 111, amplified by the first low-noise amplifier LNA1, and output from the first output terminal 103. Alternatively, when the first band-pass filter BPF1 is a transmitting filter, the first output terminal 103 functions as an input terminal, and the signal amplified by the first low-noise amplifier LNA1 and impedance-matched by the first inductor 111 passes through the first band-pass filter BPF1 and is transmitted from the antenna terminal.

The signal that has passed through the second band-pass filter BPF2 is impedance-matched by the second inductor 112, amplified by the second low-noise amplifier LNA2, and output from the second output terminal 105. Alternatively, when the second band-pass filter BPF2 is a transmitting filter, the second output terminal 105 functions as an input terminal, and the signal amplified by the second low-noise amplifier LNA2 and impedance-matched by the second inductor 112 passes through the second band-pass filter BPF2 and is transmitted from the antenna terminal.

Other configurations are omitted because they are the same as those of the explanation in the first embodiment.

According to the second embodiment of the present invention described above, it is possible to provide a module having an acoustic wave device superior in heat dissipation capability and adhesion between a sealing resin member and a wiring substrate, and the acoustic wave device includes excellent characteristics in which coupling between a metal pattern through which an electric signal of a desired frequency band passes and a metal pattern through which an electric signal of a desired frequency band does not pass is unlikely to occur, while an amount of infiltration of a sealing resin between the wiring substrate and a device chip is controlled. It should be noted that, of course, the present disclosure is not limited to the embodiments described above, but includes the embodiments that can achieve the purpose of the present disclosure While several aspects of at least the embodiment have been described, it is to be understood that various modifications and improvements will readily occur to those skilled in the art.

Such modifications and improvements are intended to be part of the present disclosure and are intended to be within the scope of the present disclosure. It is to be understood that the embodiments of the methods and apparatus described herein are not limited in application to the structural and ordering details of the components set forth in the foregoing description or illustrated in the accompanying drawings. Methods and apparatus may be implemented in other embodiments or implemented in various manners. Specific implementations are given here for illustrative purposes only and are not intended to be limiting.

The phraseology and terminology used in the present disclosure are for the purpose of description and should not be regarded as limiting. The use of “including,” “comprising,” “having,” and variations thereof herein means the inclusion of the items listed hereinafter and equivalents thereof, as well as additional items. The reference to “or” may be construed so that any term described using “or” may be indicative of one, more than one, and all of the terms of that description. References to front, back, left, right, top, bottom, and side are intended for convenience of description. Such references are not intended to limit the components of the present disclosure to any one positional or spatial orientation. Accordingly, the foregoing description and drawings are by way of example only.

What is clamed is:

1. An acoustic wave device comprising:

a wiring substrate;

a device chip flip-chip bonded on the wiring substrate via a plurality of bumps;

a metal pattern formed on an outer edge portion of the wiring substrate, the metal pattern includes an uneven portion or a jagged portion;

a plurality of bump pads formed on the wiring substrate comprises an antenna pad, a transmitting pad, a receiving pad and a ground pad;

a sealing resin member bonded to both the metal pattern and the wiring substrate, the sealing resin member hermetically seals the device chip;

a first region in which a tip direction of the uneven portion or the jagged portion is formed to orient toward the outer edge of the wiring substrate a second region in which the tip direction of the uneven portion or the jagged portion is formed to orient toward a center of the wiring substrate; and a surface acoustic wave resonator formed on the device chip and disposed in the vicinity of the first region or the second region.

2. The acoustic wave device according to claim 1, wherein the tip direction of the uneven portion or the jagged portion of the metal pattern is formed in a peripheral region of the antenna pad, the transmitting pad, or the receiving pad and is formed to orient toward the center of the wiring substrate.

3. The acoustic wave device according to claim 1, wherein the wiring substrate is a substantially rectangular shape having long sides and short sides, wherein a length of the first region in which the tip direction of the uneven portion or the jagged portion is formed to orient toward the outer edge of the wiring substrate is longer than a length of the second region in which the tip direction of the uneven portion or the jagged portion is formed to orient toward the center of the wiring substrate, and wherein the first region and the second region are in a region between two bump pads arranged along at least one of the short sides of the wiring substrate.

4. The acoustic wave device according to claim 1, wherein the wiring substrate is a substantially rectangular shape having long sides and short sides, wherein two or more regions are formed between the bump pads and are configurated by at least three of the bump pads arranged along at least one of the long sides of the wiring substrate, wherein the two or more regions includes;

a third region formed between a pair of the bump pads arranged along at least one of the long sides of the wiring substrate, wherein a length of the third region in the tip direction of the uneven portion or the jagged portion that is formed to orient toward the outer edge of the wiring substrate is longer than a length of the third region in the tip direction of the uneven portion or the jagged portion that is formed to orient toward the center of the wiring substrate, and a fourth region formed between other pair of the bump pads arranged along at least one of the long sides of the wiring substrate, wherein a length of the fourth region in the tip direction of the uneven portion or the jagged portion that is formed to orient toward the center of the wiring substrate is longer than a length of the fourth region in a tip direction of the uneven portion or the jagged portion that is formed to orient toward the outer edge of the wiring substrate.

5. The acoustic wave device according to claim 1, wherein the wiring substrate is a substantially rectangular shape having long sides and short sides, wherein two or more regions are formed between the bump pads and are configurated by at least three bump pads arranged along at least one of the long sides of the wiring substrate, wherein two regions of the two or more regions formed between the bump pads have are lengths in the tip direction of the uneven portion or the jagged portion that is formed to orient toward the outer edge of the wiring substrate are longer than lengths in the tip direction of the uneven portion or the jagged portion that is formed to orient toward the center of the wiring substrate respectively, wherein the two regions are successively disposed, and wherein the bump pad formed between the two regions has a ground potential.

6. The acoustic wave device according to claim 1, wherein a resonator disposed in the vicinity of the second region is further disposed than a resonator disposed in the vicinity of the first region from outer edge of the device ship.

7. The acoustic wave device according to claim 1, wherein the metal pattern is formed such that the tip direction of the uneven portion or the jagged portion formed is oriented toward the center of the wiring substrate in a region that is adjacent to the ground pad that is not directly bonded to the metal pattern on the wiring substrate.

8. The acoustic wave device according to claim 1, wherein the metal pattern is formed in a region adjacent to the ground pad directly bonded to the metal pattern on the wiring substrate such that the tip direction of the uneven portion or the jagged portion is oriented toward the outer edge of the wiring substrate.

9. The acoustic wave device according to claim 1, wherein the sealing resin member comprises a synthetic resin.

10. The acoustic wave device according to claim 1, wherein the device tip is a SAW filter.

11. The acoustic wave device according to claim 1, wherein the device chip is a filter using a thin film acoustic resonator.

12. The acoustic wave device according to claim 1, wherein the wiring substrate includes two device chips, and the two device chips function as a duplexer.

13. A module comprising the acoustic wave device according to claim 1.

* * * * *